(12) United States Patent
Kume et al.

(10) Patent No.: US 7,713,851 B2
(45) Date of Patent: May 11, 2010

(54) METHOD OF MANUFACTURING SILICON EPITAXIAL WAFER

(75) Inventors: Fumitaka Kume, Annaka (JP); Tomosuke Yoshida, Annaka (JP); Ken Aihara, Annaka (JP); Ryoji Hoshi, Nishigo-mura (JP); Satoshi Tobe, Annaka (JP); Naohisa Toda, Annaka (JP); Fumio Tahara, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 516 days.

(21) Appl. No.: 11/660,764

(22) PCT Filed: Aug. 3, 2005

(86) PCT No.: PCT/JP2005/014175

§ 371 (c)(1),
(2), (4) Date: Feb. 22, 2007

(87) PCT Pub. No.: WO2006/022127

PCT Pub. Date: Feb. 3, 2006

(65) Prior Publication Data

US 2007/0243699 A1 Oct. 18, 2007

(30) Foreign Application Priority Data

Aug. 25, 2004 (JP) .............................. 2004-245691

(51) Int. Cl.
*H01L 21/20* (2006.01)
(52) U.S. Cl. .................. 438/503; 438/795; 438/476; 438/253; 257/760; 257/759; 257/611; 257/618
(58) Field of Classification Search ................ 438/503, 438/795, 476, 253; 257/760, 759, 611, 618
See application file for complete search history.

(56) References Cited

U.S. PATENT DOCUMENTS 5,176,756 A 1/1993 Nakashima et al.

(Continued)

FOREIGN PATENT DOCUMENTS

JP 62-254429 11/1987

(Continued)

OTHER PUBLICATIONS

Morita, Etsuro, et al., "NH$_4$OH Cleaning," *Oyo Butsuri*, 1990, pp. 79-80, vol. 59, No. 11, Central Research Institute, Mitsubishi Metal Corporation.

*Primary Examiner*—Matthew Smith
*Assistant Examiner*—Wilner Jean Baptiste
(74) *Attorney, Agent, or Firm*—Oliff & Berridge, PLC

(57) ABSTRACT

A silicon epitaxial layer 2 is grown in vapor phase on a silicon single crystal substrate 1 manufactured by the Czochralski method, and doped with boron so as to adjust the resistivity to 0.02 Ω·cm or below, oxygen precipitation nuclei 11 are formed in the silicon single crystal substrate 1, by carrying out annealing at 450° C. to 750° C., in an oxidizing atmosphere, for a duration of time allowing formation of a silicon oxide film only to as thick as 2 nm or below on the silicon epitaxial layer 2 as a result of the annealing, and thus-formed silicon oxide film 3 is etched as the first cleaning after the low-temperature annealing, using a cleaning solution. By this process, the final residual thickness of the silicon oxide film can be suppressed only to a level equivalent to native oxide film, without relying upon the hydrofluoric acid cleaning.

4 Claims, 1 Drawing Sheet

U.S. PATENT DOCUMENTS

| | | |
|---|---|---|
| 6,239,045 B1 | 5/2001 | Tanaka et al. |
| 7,521,381 B2 * | 4/2009 | Nakada et al. ............... 438/795 |
| 2002/0157597 A1 | 10/2002 | Takeno |

FOREIGN PATENT DOCUMENTS

| | | |
|---|---|---|
| JP | 4-107922 | 4/1992 |
| JP | 7-142435 | 6/1995 |
| JP | 9-283529 | 10/1997 |
| JP | 10-270455 | 10/1998 |
| JP | 2000-31071 | 1/2000 |
| JP | 2001-345291 | 12/2001 |
| WO | WO 01/56071 A1 | 8/2001 |

* cited by examiner

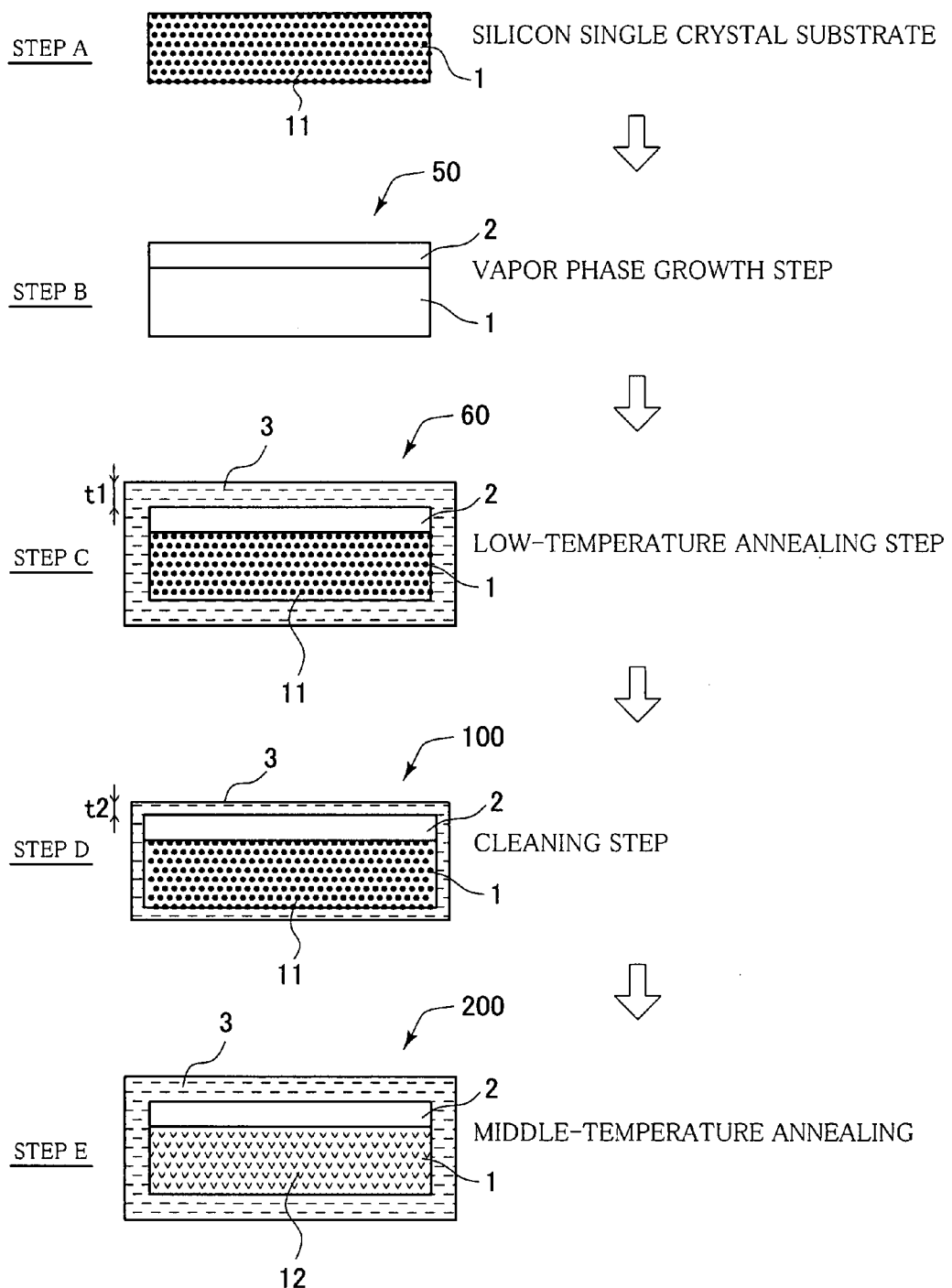

METHOD OF MANUFACTURING SILICON EPITAXIAL WAFER

RELATED APPLICATIONS

This application claims the priorities of Japanese Patent Application No. 2004-245691 filed on Aug. 25, 2004, which is incorporated herein by reference.

BACKGROUND OF THE INVENTION

1. Field of the Invention

This invention relates to a method of manufacturing a silicon epitaxial wafer having a silicon epitaxial layer formed by vapor phase growth on a silicon single crystal substrate doped with a relatively high concentration of boron.

2. Description of the Related Art

Silicon epitaxial wafers, having a silicon epitaxial layer grown in vapor phase on a silicon single crystal substrate manufactured by the Czochralski method (simply referred to as the CZ method, hereinafter), while being doped with a high concentration of boron so as to adjust the resistivity to as low as 0.02 Ω·cm or below (referred to as p$^+$CZ substrate, hereinafter), have widely been used, for example, for the purpose of preventing latch-up, and of eliminating any defects from a device forming region.

The p$^+$CZ substrate has a large number of oxygen precipitation nuclei formed in a crystal pulling process over a period from solidification of the crystal to cooling down to room temperature. Size of the oxygen precipitation nuclei is generally as very small as 1 nm or below. The oxygen precipitation nuclei can grow up to oxygen precipitate, if the nuclei are kept at a temperature not lower than a nuclei forming temperature and not higher than a certain critical temperature relevant to re-solid solubility into the bulk of silicon single crystal. The oxygen precipitate is a sort of BMD (bulk microdefect) causative of deterioration of withstand voltage and current leakage, so that it is desired to be formed as less as possible in the device forming region. The oxygen precipitate can, however, effectively be used as a getter for heavy metal components in a device manufacturing process, in regions of the substrate not destined for device formation, so that it has been a general practice to intentionally form the oxygen precipitate in the silicon single crystal used for growth in the manufacture of silicon epitaxial wafers, only to a degree not causative of nonconformities such as warping. The effect of gettering heavy metals by the oxygen precipitate is one of so-called IG (intrinsic gettering) effects.

By the way, the oxygen precipitation nuclei are known to re-solid-solubilize themselves into the bulk of silicon single crystal and disappear, if the substrate is kept at a temperature higher than the above-described critical temperature. As for the silicon epitaxial wafers, vapor phase growth process of the silicon epitaxial layer corresponds to high temperature annealing at 1,100° C. or above where the nuclei disappear, and this means that the oxygen precipitation nuclei, resided abundantly before the vapor phase growth, can largely be reduced due to thermal history during the vapor phase growth. Reduction in the oxygen precipitation nuclei suppresses formation of the oxygen precipitate in the process of manufacturing semiconductor devices, even if the initial oxygen concentration in the adopted silicon single crystal substrate is high, and achieving the IG effect is less hopeful.

Aiming at solving this problem, there is proposed a method of subjecting a silicon epitaxial wafer to low temperature annealing at 450° C. to 750° C., both ends inclusive, so as to newly produce the oxygen precipitation nuclei in the p$^+$CZ substrate, and then to middle-temperature annealing (a temperature range between those for low-temperature annealing and high-temperature annealing) to thereby grow the oxygen precipitate (Japanese Laid-Open Patent Publication Nos. H9-283529, H10-270455, and International Patent Disclosure WO01/056071).

Japanese Laid-Open Patent Publication No. H9-283529 describes, in the section titled "Preferred Embodiments of the Invention", that low-temperature annealing aimed at forming the oxygen precipitation nuclei in an oxygen atmosphere results in formation of silicon oxide film on the surface of the silicon epitaxial wafer. Thus-formed unnecessary silicon oxide film can be removed by hydrofluoric acid cleaning, as is well known in the art. Removal of the silicon oxide film by the hydrofluoric acid cleaning, however, raises the particle level on the surface of the silicon epitaxial wafer after the cleaning. Adoption of the hydrofluoric acid cleaning aimed at removing the silicon oxide film after the low-temperature annealing also increases the number of process steps, and consequently increases costs for manufacturing the silicon epitaxial wafers.

It is therefore a subject of this invention to provide a method of manufacturing a silicon epitaxial wafer, on the premise that annealing for forming oxygen precipitation nuclei is carried out in an oxidizing atmosphere, capable of suppressing the final residual thickness of the silicon oxide film formed during the annealing to a level equivalent to that of native oxide film without adopting hydrofluoric acid cleaning, and furthermore suppressing increase in the particles after the cleaning.

SUMMARY OF THE INVENTION

Aimed at solving the above-described subjects, a method of manufacturing a silicon epitaxial wafer of this invention includes:

a vapor phase growth step allowing a silicon epitaxial layer to grow in vapor phase on a silicon single crystal substrate manufactured by the Czochralski method, and doped with boron so as to adjust the resistivity to 0.02 Ω·cm or below;

a low-temperature annealing step forming, following the vapor phase growth step, oxygen precipitation nuclei in the silicon single crystal substrate, by carrying out annealing at 450° C. to 750° C., both ends inclusive, in an oxidizing atmosphere, for a duration of time allowing formation of a silicon oxide film only to as thick as 2 nm or below on the silicon epitaxial layer as a result of the annealing; and a cleaning step, as the first cleaning step after the low-temperature annealing step, etching the silicon oxide film formed in the low-temperature annealing step, using a cleaning solution composed of a mixed solution of ammonia, hydrogen peroxide and water, all of these steps being executed in this order.

As cleaning solutions for cleaning the silicon epitaxial wafers having widely been accepted in general, there are three known cleaning solutions proposed by RCA, a US company:

(1) a mixed solution of ammonia, hydrogen peroxide and water (representative composition is SC-1 cleaning solution described later), used for removing organic pollution and particles;

(2) an aqueous hydrofluoric acid solution, for removal of silicon oxide film; and (3) a mixed solution of hydrochloric acid, hydrogen peroxide and water (representative composition is SC-2 solution described later), used for removing surficial metal impurities.

All of these solutions are almost standardized in this industry, and purposes of use of the individual solutions are clearly discriminated as shown in the above, so that it could be said that there is almost no opportunity of using them beyond their purposes of use. Considering the subjects of this invention, it is therefore sensible to use (2) a hydrofluoric acid solution, for the purpose of removing the silicon oxide film formed in the low-temperature annealing step. The cleaning using hydrofluoric acid (also referred to as hydrofluoric acid cleaning, hereinafter), however, increases the particle count on the wafer surface as described in the above. For the purpose of removing the particles undesirably increased in the process of the hydrofluoric acid cleaning, it is therefore a commonsense for those skilled in the art to further carry out the SC-1 cleaning using the mixed solution (1) of ammonia, hydrogen peroxide and water, that is, so-called, two-step cleaning.

This invention was completed paying by attention to a certain level of etching effect of the cleaning solution (1) composed of the mixed solution of ammonia, hydrogen peroxide and water over the silicon oxide film, although of course only to a level smaller than that attainable by the hydrofluoric acid cleaning solution (2), so as to turn over the above-described commonsense such that "hydrofluoric acid is indispensable for removal of the silicon oxide film". In other words, conditions for the low-temperature annealing (temperature and time) for forming the oxygen precipitation nuclei are selected, so as to make the amount of increase in the silicon oxide film in the process of low-temperature annealing under an oxidizing atmosphere almost comparative to the thickness removable by etching using the cleaning solution described above. More specifically, temperature of the low-temperature annealing is set within the range from 450° C. or above and 750° C. or below, in which formation of the oxygen precipitation nuclei in the $p^+$CZ substrate becomes distinct, and the annealing time is set so as to make the thickness of the oxide film formed on the silicon epitaxial layer as a result of the annealing as small as 2 nm or below. Following the low-temperature annealing step under these conditions, the silicon oxide film is etched, using the cleaning solution (1), as the first cleaning step after the low-temperature annealing step.

In the above-described method, the thickness of the silicon oxide film increases in the low-temperature annealing, but the conditions of the annealing are selected so as to make the thickness after the low-temperature annealing to as small as 2 nm or below. Thereafter, the wafer is directly subjected to cleaning using the cleaning solution (1), which has generally been understood as being used for removal of particles, so as to make full use of a latent and limitative etching ability owned by the cleaning solution, so that the increased portion of the silicon oxide film as a result of the low-temperature annealing can effectively be reduced. As a consequence, while being on the premise of annealing the wafer in order to form the oxygen precipitation nuclei in an oxidizing atmosphere, the final residual thickness of the silicon oxide film formed during the annealing can be suppressed only to a level equivalent to native oxide film, without relying upon the hydrofluoric acid cleaning. The cleaning solution (1) is intrinsically excellent in the effect of removing particles, so that also increase in the particles after the cleaning can be suppressed. In this case, it is feasible enough to reduce the particle count on the silicon epitaxial layer after the cleaning step, to a level lower than the particle count attained before the cleaning step, and thereby nonconformities ascribable to the particles can effectively be reduced.

The thickness of the silicon oxide film after the cleaning step naturally becomes smaller than that attained after the low-temperature annealing, contributed by the etching effect of the above-described cleaning solution. On the other hand, from the viewpoint of surface protection of the silicon epitaxial layer, it is preferable that the silicon oxide film remains to as thick as 1 nm or above, equivalent to the level of native oxide film, even after the cleaning step. The cleaning solution (1) has a cleaning activity ascribable to ammonia, enhanced through addition of hydrogen peroxide which is a relatively strong oxidizer, so that the solution can repair the silicon oxide film to as thick as 1 nm or more, by virtue of the oxidizing ability of hydrogen peroxide, even when the silicon oxide film is excessively thin.

Next, the resistivity of the silicon single crystal substrate exceeding 0.02 Ω·cm fails in ensuring a density of formation of the oxygen precipitation nuclei sufficient for ensuring the IG effect, because concentration of boron capable of promoting the oxygen precipitation becomes too small, and consequently the number of oxygen precipitation nuclei decreases. In particular in this invention, the low-temperature annealing is finished within a relatively short period of time, so as to control the thickness of the silicon oxide film to as small as 2 nm or below as described in the above, so that it is important to set the resistivity of the silicon single crystal substrate to as small as 0.02 Ω·cm or below, in view of ensuring a necessary number of oxygen precipitation nuclei. From this point of view, the resistivity of the substrate is preferably set to less than 0.014 Ω·cm. On the other hand, in view of suppressing warping of the substrate or the like due to excessive increase in the density of formation of the oxygen precipitate, the resistivity of the substrate is preferably set to 0.011 Ω·cm or above.

The temperature of the low-temperature annealing of lower than 450° C. extremely reduces the number of formation of the oxygen precipitation nuclei, and on the contrary, the temperature exceeding 750° C. results in insufficient number of formation of the oxygen precipitation nuclei, due to excessively low degree of super-saturation of the interstitial oxygen. The temperature of the low-temperature annealing is, therefore, set in the range from 450° C. to 750° C., both ends inclusive.

The initial oxygen concentration in the silicon single crystal substrate is preferably $6 \times 10^{17}$ cm$^{-3}$ to $10 \times 10^{17}$ cm$^{-3}$, both ends inclusive. The initial oxygen concentration of less than $6 \times 10^{17}$ cm$^{-3}$ fails in ensuring a sufficient density of formation of oxygen precipitate, and consequently fails in fully expecting the IG effect. On the contrary, the initial oxygen concentration exceeding $10 \times 10^{17}$ cm$^{-3}$ results in excessive density of formation of oxygen precipitate, and may be more likely to induce sharp increase in wafer deformation such as warping. It is to be noted that the oxygen concentration in this patent specification is expressed in unit based on criteria of JEIDA (acronym for Japanese Electronic Industry Development Association, renamed JEITA (Japan Electronics and Information Technology Industries Association) at present).

By the low-temperature annealing carried out within the above-described temperature range after the vapor phase growth step, the oxygen precipitation nuclei once disappeared or decreased during the vapor phase growth step can be recovered up to a density of formation necessary for ensuring the IG effect. By further carrying out the middle-temperature annealing at a temperature higher than that in the low-temperature annealing and lower than that in the vapor phase growth, more specifically 800° C. or above and lower than 1,100° C., the oxygen precipitation nuclei can be grown up to oxygen precipitate.

A cleaning solution adoptable to this invention is the SC-1 (standard cleaning 1) solution. In general, a SC-1 cleaning solution having a ratio of mixing by volume of (28 wt % aqueous ammonia solution):(30 to 35 wt % hydrogen peroxide):(water) of 1:(1 to 2):(5 to 7), both ends inclusive, can decrease the thickness of the silicon oxide film to a level of native oxide film without problems, and show a large effect of removing particles, so far as the silicon oxide film is limited to as thick as 2 nm or below before the SC-1 cleaning. In recent years, various improvements have been made on the composition of the SC-1 cleaning solution, wherein, for example, Morita et al. OYO BUTSURI, Vol. 59, No. 11, pp. 79-80, 1990) introduces a composition of a cleaning solution of (aqueous $NH_3$):(aqueous $H_2O_2$):$H_2O$=1:1:(10 or 15) reduced in the chemical contents as compared with conventional ones, and claims that cleaning property of the SC-1 cleaning depends on ratio of concentration of ammonia and hydrogen peroxide, wherein ratio of water is irrespective of etch rate under a constant ratio of ammonia and hydrogen peroxide. Also in the invention described in Japanese Laid-Open Patent Publication No. H4-107922, volumetric ratio of hydrogen peroxide in a cleaning solution is made larger than that of an aqueous ammonium solution, and ratio of water is increased, for the purpose of lowering the amount of etching and costs for the chemicals. The invention described in Japanese Laid-Open Patent Publication No. H7-142435 decreases amount of use of ammonia by controlling ammonia concentration in the SC-1 cleaning solution lowered from 4.3 wt % which is the generally adopted concentration, down to a limited range of 2.0 to 3.5 wt %.

Depth of etching in the silicon oxide film attained by a single execution using the SC-1 cleaning solution is approximately 1 nm, so that the silicon oxide film having a thickness of 2 nm or smaller before the cleaning step may be reduced by etching in the thickness thereof only to as thin as less than 1 nm, but the final thickness of the silicon oxide film is stabilized at approximately 1 nm, as a result of the above-described repairing effect by hydrogen peroxide. This is advantageous also in terms of improving uniformity in thickness of the silicon oxide film after the cleaning. It is to be noted herein that the thickness denoted as X nm in this patent specification means that the thickness falls in the range of ±10% centered round X nm.

BRIEF DESCRIPTION OF THE DRAWINGS

FIG. 1 is an explanatory drawing sequentially showing process steps in an exemplary method of manufacturing a silicon epitaxial wafer according to this invention.

BEST MODES FOR CARRYING OUT THE INVENTION

Paragraphs below will describe best modes for carrying out this invention, referring to the attached drawings.

FIG. 1 is an explanatory drawings sequentially showing process steps of an exemplary method of manufacturing a silicon epitaxial wafer according to this invention. First, a $p^+$CZ-type silicon single crystal substrate 1 (simply referred to as "substrate 1", hereinafter) adjusted as having a resistivity of 0.02 Ω·cm or below through addition of boron, and an initial oxygen concentration of $6 \times 10^{17}$ cm$^{-3}$ to $10 \times 10^{17}$ cm$^{-3}$, both ends inclusive, is prepared (FIG. 1, step A). The lower limit of the resistivity of the substrate 1 is specified by the solid solubility limit of boron into silicon, wherein resistivity of the substrate 1 currently available for manufacturing of semiconductor devices is 0.0005 Ω·cm (0.5 mΩ·cm) or above. The substrate 1 has oxygen precipitation nuclei 11 formed therein over the period from solidification of the silicon single crystal in the crystal pulling process to cooling down to room temperature.

Next in a vapor phase growth step, a silicon epitaxial layer 2 is grown in vapor phase on the substrate 1 at 1,100° C. or above, to obtain a silicon epitaxial wafer 50 (FIG. 1, step B). Because the vapor phase growth process is carried out at a high temperature of 1,100° C. or above, most of the oxygen precipitation nuclei 11 in the substrate 1 formed during the crystal pulling process are solid-solubilized.

After completion of the vapor phase growth step, the silicon epitaxial wafer 50 is loaded in an annealing furnace not shown, and subjected to low-temperature annealing at 450° C. to 750° C., both ends inclusive, in an oxidizing atmosphere, so as to reproduce the oxygen precipitation nuclei 11 in the substrate 1, to thereby obtain a silicon epitaxial wafer 60 (FIG. 1, step C). The oxidizing atmosphere is typically an atmosphere obtained by diluting a dry oxygen with an inert gas such as nitrogen, or may be a pure dry oxygen. The low-temperature annealing at a temperature below 450° C. extremely retards diffusion of the interstitial oxygen, and makes the oxygen precipitation nuclei 11 less likely to be produced. On the other hand, the low-temperature annealing exceeding 750° C. lowers the degree of super-saturation of the interstitial oxygen, and again makes the oxygen precipitation nuclei 11 less likely to be produced.

In this invention, the low-temperature annealing described above is carried out only for a duration of time allowing the silicon oxide film 3 to grow up to a thickness t1 of 2 nm or less as a result of the annealing. The annealing is preferably carried out within a short period of time of 4 hours or less, although a specific annealing time may vary depending on the annealing temperature. The annealing time less than one hour may, however, result in only an insufficient formation of the oxygen precipitation nuclei in the substrate 1, so that the annealing time is set to one hour or longer. Because the annealing in this case is only effected for a short duration of time, the substrate having a resistivity of higher than 0.02 Ω·cm limits the density of the oxygen precipitate formable during the succeeding middle-temperature annealing only to as large as the level of $10^8$ cm$^{-3}$ and consequently makes it difficult to form the oxygen precipitate to the level of $10^9$ cm$^{-3}$ or above for which a sufficient level of IG (intrinsic gettering) effect can be expected. It is therefore necessary to use the substrate 1 having a resistivity of 0.02 Ω·cm or below.

After completion of the low-temperature annealing step described above, cleaning using the SC-1 cleaning solution (also referred to as "SC-1 cleaning", hereinafter) is carried out as the first cleaning, so as to remove any particles adhered on the surface of the silicon epitaxial wafer 60, and so as to etch the silicon oxide film 3 formed on the surface of the wafer 60 (FIG. 1, step D). The SC-1 cleaning is carried out generally in the cleaning process after vapor phase growth, and moreover, it is a general practice to carry out the hydrofluoric acid cleaning prior to the SC-1 cleaning when it is desired to remove the silicon oxide film. The hydrofluoric acid cleaning, however, tends to raise the particle level on the wafer surface, and increases the number of process steps, so that this invention makes use of an etching effect owned by the SC-1 cleaning solution to thereby reduce the thickness t1 of the silicon oxide film 3, without relying upon the hydrofluoric acid cleaning.

In the SC-1 cleaning, approximately 1 nm of silicon oxide film 3 can be etched by a single execution of the cleaning step, by virtue of the etching action of ammonia contained in the cleaning solution. Because the thickness t1 of the silicon oxide film 3 formed in the low-temperature annealing step in this invention is 2 nm or less, thickness t2 of the silicon oxide film 3 after the cleaning step is supposed to be thinner than 1 nm. However, for the case where the thickness t2 of the silicon oxide film 3 becomes thinner than 1 nm, the oxidizing action of hydrogen peroxide becomes distinct, and can thicken the silicon oxide film up to 1 nm or more. However, for the case where the thickness t1 of the silicon oxide film 3 formed in the low-temperature annealing step is thicker than 2 nm, it is difficult to reduce the thickness to as thin as approximately 1 nm by a single execution of the SC-1 cleaning step. It is to be noted that, in the cleaning step described above, the SC-1 cleaning may further be followed by the SC-2 cleaning (using a mixed solution of hydrochloric acid, hydrogen peroxide and water), if necessary.

After completion of the cleaning step, the resultant silicon epitaxial wafer 100 is subjected to the middle-temperature annealing for manufacturing ICs or the like, for example, in the device forming process (FIG. 1, step E), wherein the oxygen precipitation nuclei 11 grow by the middle-temperature annealing, and thereby the oxygen precipitate 12 having the gettering effect are formed. The annealing carried out in an oxidizing atmosphere can thicken the silicon oxide film 3 on a silicon epitaxial wafer 200.

It was experimentally confirmed how the amount of change in the particle level before and after the cleaning differs between the cases where the hydrofluoric acid cleaning was adopted or not before the SC-1 cleaning. Results will be explained below. When the silicon eptaxial wafer having the silicon oxide film formed thereon was subjected to the hydrofluoric acid cleaning, followed by the SC-1 and the SC-2 cleaning, particles having a diameter of 0.1 μm or larger increase by an average of 0.5 particles/wafer by a series of these cleaning steps. In contrast, for the case where the SC-1 cleaning was not preceded by the hydrofluoric acid cleaning, particles decrease by an average of 0.8 particles/wafer.

That is, when the silicon epitaxial wafer 50, obtained by allowing the silicon epitaxial layer 2 to grow in vapor phase on the p$^+$CZ-type silicon single crystal substrate 1 having a resistivity of 0.02 Ω·cm or below, is subjected to the low-temperature annealing in an oxidizing atmosphere for the purpose of forming the oxygen precipitation nuclei 11, control of the thickness t1 of the silicon oxide film 3 formed thereon to as small as 2 nm or below makes it possible to adjust the thickness t2 of the silicon oxide film 3 to approximately 1 nm, equivalent to the level of native oxide film, by the SC-1 cleaning. Even for the case where the SC-1 cleaning directly follows the vapor phase growth without being preceded by the low-temperature annealing, the silicon oxide film can be adjusted to as thin as approximately 1 nm, so that the thickness t2 of the silicon oxide film can be controlled to a level equivalent to that of native oxide film, without relying upon the hydrofluoric acid cleaning which tends to increase the particle level.

EXAMPLES

Paragraphs below will further specifically explain this invention, referring to Example. It is to be noted that oxygen concentration in the silicon single crystal substrate described in these Examples is obtained by converting a value measured by the inert gas fusion method, using correlation between results obtained for a substrate having a standard resistivity (1 to 20 Ω·cm) by the Fourier transformation infrared spectrophotometry and the inert gas fusion method.

The boron-doped silicon single crystal substrate 1 having a resistivity of 0.011 Ω·cm and an initial oxygen concentration of $6.7 \times 10^{17}$ cm$^{-3}$ (13.4 ppma) was prepared, and the silicon epitaxial layer 2 having a resistivity of 20 Ω·cm and a thickness of 5 μm was grown in vapor phase at 1,100° C., on the (100) main surface of the substrate 1, to thereby obtain the silicon epitaxial wafer 50. Next, thus-obtained silicon epitaxial wafer 50 was subjected to the low-temperature annealing at 650° C. for 1 hour, in an oxidizing atmosphere containing 3% of oxygen and 97% of nitrogen, for producing the oxygen precipitation nuclei. The thickness t1 of the silicon oxide film 3 formed by the low-temperature annealing was measured to be 2 nm by ellipsometry. The resultant silicon epitaxial wafer 60 was subjected to the SC-1 cleaning, and was measured to have the thickness t2 of the silicon oxide film of 1 nm. The wafer was then subjected to the middle-temperature annealing at 800° C. for 4 hours, and further at 1,000° C. for 16 hours, so as to grow the oxygen precipitation nuclei up to the oxygen precipitate. The density of the oxygen precipitate was evaluated as $2 \times 10^{10}$ cm$^{-3}$ by the infrared scattering tomography.

For comparison, after the silicon epitaxial wafer 50 was obtained under the same conditions as described in the above, the thickness of the silicon oxide film measured without being preceded by the low-temperature annealing at 650° C. for 1 hour was measured to be 1 nm by ellipsometry. The thickness of the silicon oxide film obtained after subjecting the silicon epitaxial wafer further to the SC-1 cleaning was measured to be 0.9 nm. The density of the oxygen precipitate obtained after subjecting the wafer to the middle-temperature annealing at 800° C. for 4 hours, and further at 1,000° C. for 16 hours, was evaluated as $5 \times 10^6$ cm$^{-3}$ by the infrared scattering tomography.

What is claimed is:

1. A method of manufacturing a silicon epitaxial wafer comprising:
   a vapor phase growth step allowing a silicon epitaxial layer to grow in vapor phase on a silicon single crystal substrate manufactured by the Czochralski method, and doped with boron so as to adjust the resistivity to 0.02 Ω·cm or below;
   a low-temperature annealing step forming, following the vapor phase growth step, oxygen precipitation nuclei in the silicon single crystal substrate, by carrying out annealing at 450° C. to 750° C., both ends inclusive, in an oxidizing atmosphere for a duration of time allowing formation of a silicon oxide film only to as thick as 2 nm or below on the silicon epitaxial layer as a result of the annealing; and
   a cleaning step, as the first cleaning step after the low-temperature annealing step, etching the silicon oxide film formed in the low-temperature annealing step, using a cleaning solution composed of a mixed solution of ammonia, hydrogen peroxide and water,
   all of these steps being executed in this order, wherein a thickness of the silicon oxide film after the cleaning step is smaller than the thickness attained after the annealing step, and is adjusted to 1 nm or above.

2. The method of manufacturing a silicon epitaxial wafer claimed in claim 1, wherein particle count on the silicon epitaxial layer after execution of the cleaning step is smaller than the particle count before the cleaning step.

3. The method of manufacturing a silicon epitaxial wafer claimed in claim 2, wherein SC-1 cleaning solution is used as the cleaning solution.

4. The method of manufacturing a silicon epitaxial wafer claimed in claim 1, wherein SC-1 cleaning solution is used as the cleaning solution.

* * * * *